(12) United States Patent
Pham

(10) Patent No.: US 8,618,616 B2
(45) Date of Patent: Dec. 31, 2013

(54) FINFET STRUCTURES AND METHODS FOR FABRICATING THE SAME

(75) Inventor: Daniel Thanh Khac Pham, Clifton Park, NY (US)

(73) Assignee: Globalfoundries, Inc., Grand Cayman (KY)

( * ) Notice: Subject to any disclaimer, the term of this patent is extended or adjusted under 35 U.S.C. 154(b) by 46 days.

(21) Appl. No.: 13/447,019

(22) Filed: Apr. 13, 2012

(65) Prior Publication Data

US 2012/0199918 A1   Aug. 9, 2012

(51) Int. Cl.
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |

(52) U.S. Cl.
USPC .............. 257/401; 257/E21.19; 438/587

(58) Field of Classification Search
USPC .............. 438/587; 257/401, E21.19, E29.255
See application file for complete search history.

(56) References Cited

U.S. PATENT DOCUMENTS

| 7,985,639 B2 * | 7/2011 | Johnson et al. ........... 438/197 |
| 2005/0077553 A1 * | 4/2005 | Kim et al. .................. 257/288 |
| 2008/0135935 A1 * | 6/2008 | Cho et al. .................. 257/347 |

OTHER PUBLICATIONS

Ji-Woon Yang et al., "Optimization of Source/Drain Extension for Robust Speed Performance to Process Variation in Undoped Double-Gate CMOS", VLSI Technology Conference Presentation (2006).

* cited by examiner

Primary Examiner — Phuc Dang
(74) Attorney, Agent, or Firm — Ingrassia Fisher & Lorenz, P.C.

(57) ABSTRACT

A method for fabricating a FinFET structure includes fabricating a plurality of parallel fins overlying a semiconductor substrate, each of the plurality of parallel fins having sidewalls and forming an electrode over the semiconductor substrate and between the parallel fins. The electrode is configured to direct an electrical field into the fins, thereby affecting the threshold voltage of the FinFET structure.

20 Claims, 4 Drawing Sheets

FINFET STRUCTURES AND METHODS FOR FABRICATING THE SAME

FIELD OF THE INVENTION

The present invention generally relates to semiconductor devices and methods for fabricating semiconductor devices, and more particularly relates to FinFET structures and methods for fabricating the same.

BACKGROUND OF THE INVENTION

In contrast to traditional planar metal-oxide-semiconductor field-effect transistors (MOSFETs), which are fabricated using conventional lithographic fabrication methods, nonplanar FETs incorporate various vertical transistor structures. One such semiconductor structure is the "FinFET," which takes its name from the multiple thin silicon "fins" that are used to form the respective gate channels, and which are typically on the order of tens of nanometers in width.

More particularly, referring to the exemplary prior art nonplanar FET structure shown in FIG. 1, a FinFET 100 generally includes two or more parallel silicon fin structures (or simply "fins") 104 and 106. These structures are typically formed using a silicon-on-insulator (SOI) substrate (not shown) or alternatively on a bulk substrate, with fins 104 and 106 extending between a common drain electrode and a common source electrode (not shown). A conductive gate structure 102 "wraps around" three sides of both fins 104 and 106, and is separated from the fins by a standard gate oxide layer 103. While FIG. 1 illustrates only one gate structure 102 wrapped around fins 104 and 106, two, three or more parallel gate structures can be wrapped around the fins. Fins 104 and 106 may be suitably doped to produce the desired FET polarity, as is known in the art, such that a gate channel is formed within the near surface of the fins adjacent to gate oxide 103. The width of the gate, indicated by double-headed arrow 108, determines the effective channel length of the device.

In order to control the threshold voltage ($V_{th}$) of a FinFET device, various techniques are currently being applied in the art. One technique involves varying the thickness of the fin. Another technique involves varying the thickness of the gate. Yet another technique involves doping the fin channel. Each of these techniques, however, has ultimately proven unsatisfactory due to the limited effect they have on $V_{th}$, and the inherent performance trade-offs that come with increasing the thickness of the fin or the gate.

Accordingly, it is desirable to provide FinFET structures and methods for fabricating FinFET structures with improved control over the $V_{th}$. Furthermore, other desirable features and characteristics of the present invention will become apparent from the subsequent detailed description of the invention and the appended claims, taken in conjunction with the accompanying drawings, the brief summary, and this background of the invention.

BRIEF SUMMARY OF THE INVENTION

FinFET structures and methods for fabricating FinFET structures are provided herein. In accordance with an exemplary embodiment of the present invention, a method for fabricating a FinFET structure includes fabricating a plurality of parallel fins overlying a semiconductor substrate, each of the plurality of parallel fins having sidewalls and forming a bottom or substrate electrode over the semiconductor substrate and located at the bottom between the parallel fins and isolated with the FinFET device. The electrode is configured to direct an electrical field into the fins, thereby affecting the threshold voltage of the FinFET structure.

In accordance with another exemplary embodiment of the present invention, a method for fabricating a semiconductor device includes providing a semiconductor substrate, fabricating a plurality of parallel fins overlying the semiconductor substrate, each of the plurality of parallel fins having sidewalls, and forming a bottom or substrate electrode over the semiconductor substrate and located at the bottom between the parallel fins and isolated with the FinFET device. The electrode is configured to direct an electrical field into the fins, thereby affecting the threshold voltage of the FinFET structure.

In accordance with yet another exemplary embodiment of the present invention, a FinFET structure on a semiconductor device includes a plurality of parallel fins overlying a semiconductor substrate, each of the plurality of parallel fins having sidewalls and an electrode formed over the semiconductor substrate and between the parallel fins. The electrode is configured to direct an electrical field into the fins, thereby affecting the threshold voltage of the FinFET structure.

In a further aspect of the present disclosure. stress materials (electrode and dielectric) in a local isolation area between fins provide tensile or compression stress to the FinFET device channel. Because metal material is located at the bottom of the electrode and because metal film usually high stress, this stress can transfer to the silicon channel, and thereby improve the electric properties of the FinFET device.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 2:
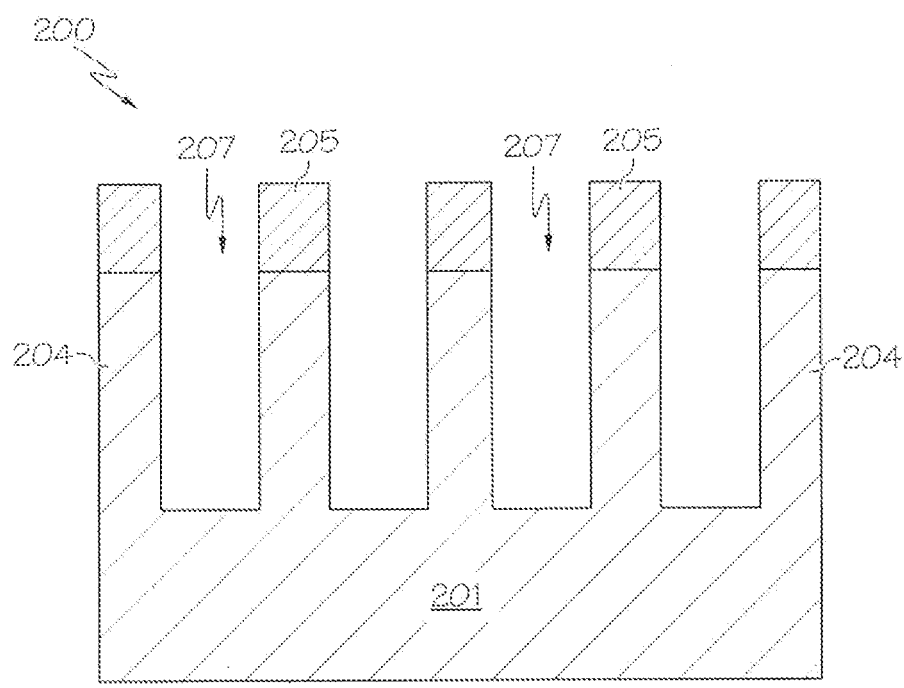
FIGS. 2-8 are cross-sectional views of a FinFET structure illustrating methods for fabricating a FinFET structure with improved control over $V_{th}$ in accordance with the present invention.

Referring to FIG. 2, a cross-sectional view of a FinFET structure 200 is provided to illustrate a first step in an exemplary method for forming a FinFET structure with improved control over $V_{th}$. The FinFET structure includes a plurality of fins 204 extending parallel to one another from a bulk substrate 201. In the alternative, substrate 201 could be an SOI substrate. The fins 204 are formed using methods that are well known in the art. For example, as shown in FIG. 2, a hard mask layer 205 is selectively deposited over bulk substrate 201, and then an etchant is applied to etch back the bulk substrate 201 where the mask layer 205 is not applied. The hard mask layer 205 may include a silicon oxide, or other hard mask layer material known in the art. As such, the fins 204 are formed beneath the mask layer 205, and the spaces 207 between the fins 204, also known as fin isolation spaces, are removed by the etchant. The width of the fins 204 is generally between about 8 nm and about 20 nm. The width of the spaces 207 between the fins 204 is generally between about 15 nm and 80 nm. The depth of the spaces 207 between the fins 204 is generally between about 20 nm to 250 nm.

Figure 3:
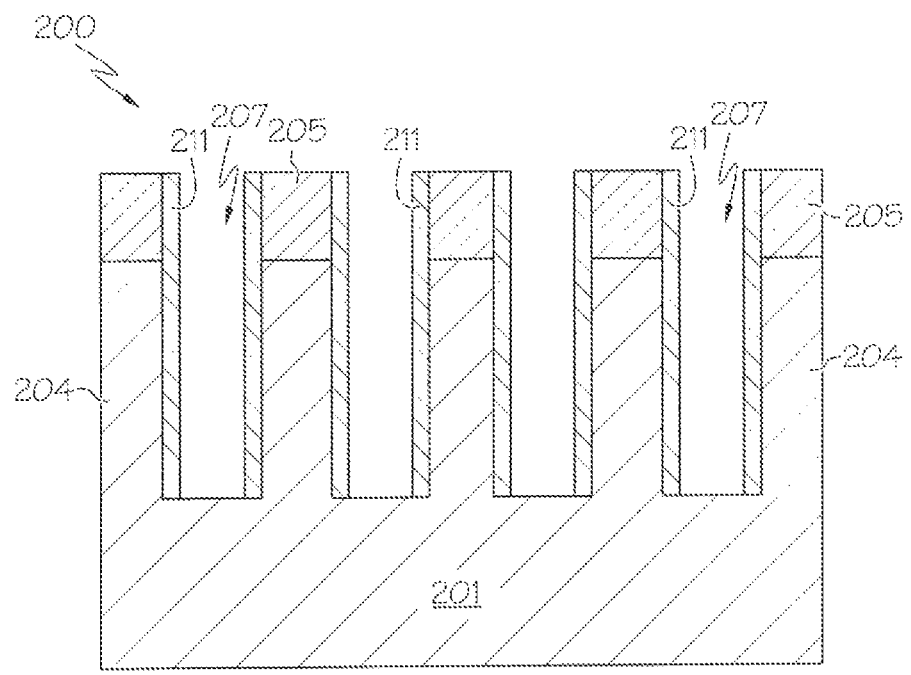

Referring to FIG. 3, after the fins 204 are formed, a side wall spacer layer 211 is deposited along the sides of the fins 204. The side wall spacer layer 211 can include a dielectric material such as, for example, silicon nitride or silicon oxide. The side wall spacer layer 211 is conformally blanket-deposited overlying the surface of semiconductor substrate 200. The side wall spacer layer 211 is provided along the sides of the fins 204 to protect the sides of the fins from further etching procedures, as will be discussed in greater detail below. The side wall spacer layer 211 can be deposited using chemical vapor deposition (CVD) techniques, or other techniques as are known in the art.

Figure 4:
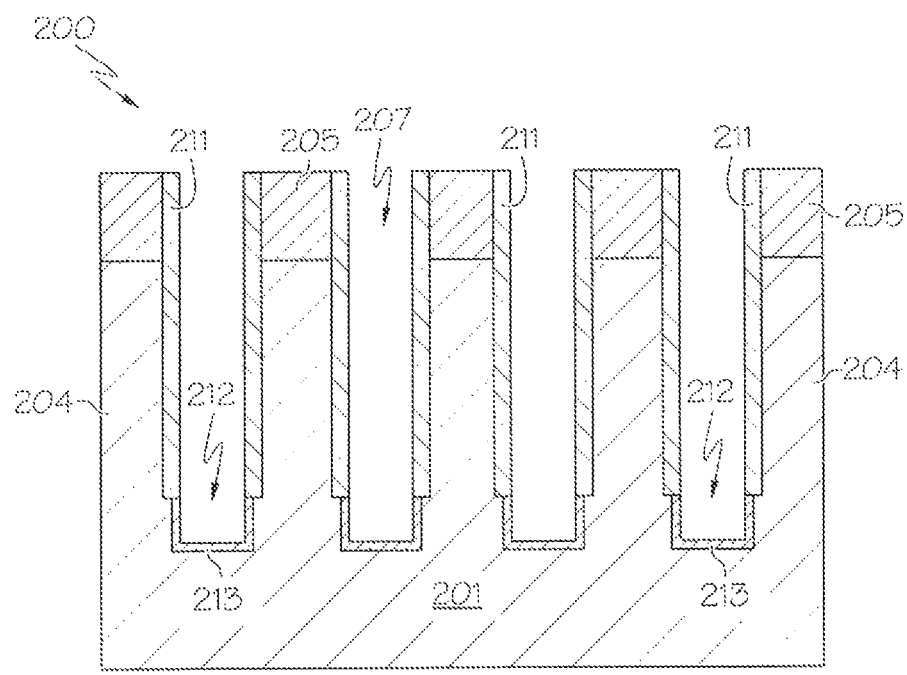

Referring to FIG. 4, after the side wall spacer layer 211 has been deposited onto the sides of the fins 204, a further etching procedure is performed to remove additional silicon material between the fins 204. In some embodiments, the etch can be an isotropic etch to widen the space. In this embodiment, a resulting overlap and underlap between the fin channel and the bottom electrode (discussed in greater detail below) affects the electrical field in the channel, and thereby provides an effect on $V_t$.

It is noted that the spacing between the fins 204 in the area 212 removed by this second etching procedure is slightly narrower than the spacing between the fins 204 created by the previously described etching procedure (with reference to FIG. 2), due to the presence of the side wall spacer layer 211. After the further etching, the structure 200 is thermally treated so as to form a thermal oxide layer 213 in the area 212. The thermal oxide layer 213 is formed in the area 212 along the sides of the fins 204 below where the side wall spacer layer 211 was deposited prior to etching and also along the substrate 201 between the fins 204, as depicted in FIG. 4.

Figure 5:
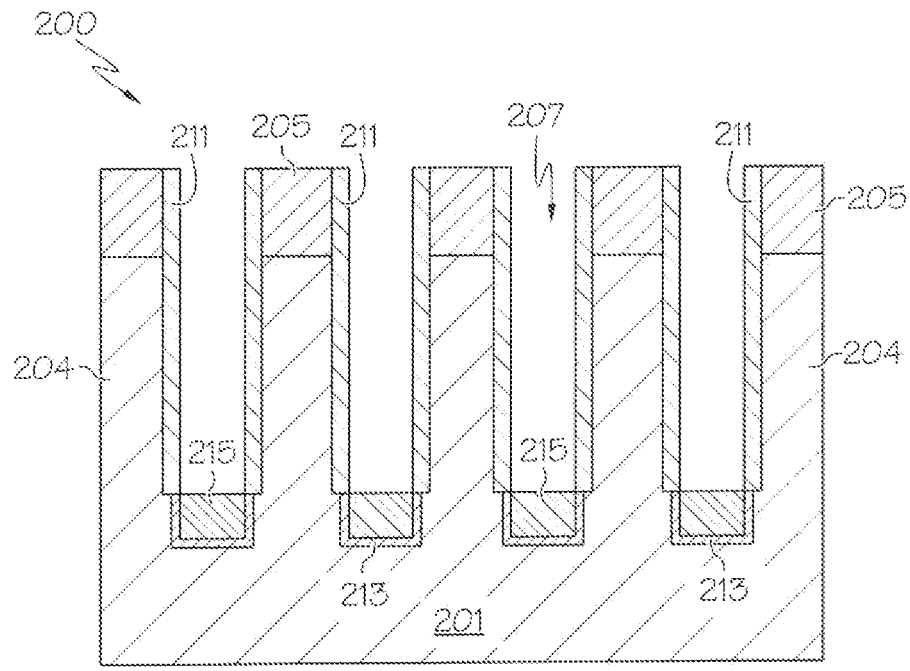

Referring to FIG. 5, after growth of the thermal oxide layer 213, a "bottom" electrode 215 is formed in the area 212. The bottom electrode 215 can be formed by the deposition of one or more electrode materials into the area 212. In one example, the bottom electrode is formed by the deposition of TiN. In another example, the bottom electrode is formed by the deposition of doped polysilicon. After deposition of the electrode material, the material is recessed to the desired thickness, which corresponds with the depth of the area 212 created during the second etching procedure described above with regard to FIG. 4. Where TiN is used, the concentration of N can be varied to provide compression or tensile strength between the fins 204 to control electron flow therein, as is known in the art. Furthermore, where polysilicon is used, the electrode 215, after being recessed, is partially or fully silicidated with a metal, or it may remain as doped polysilicon. After the contact is formed to the bottom electrode, trench silicidation can be formed to make the contact with the bottom electrode, to form the completed electrode 215.

Figure 6:
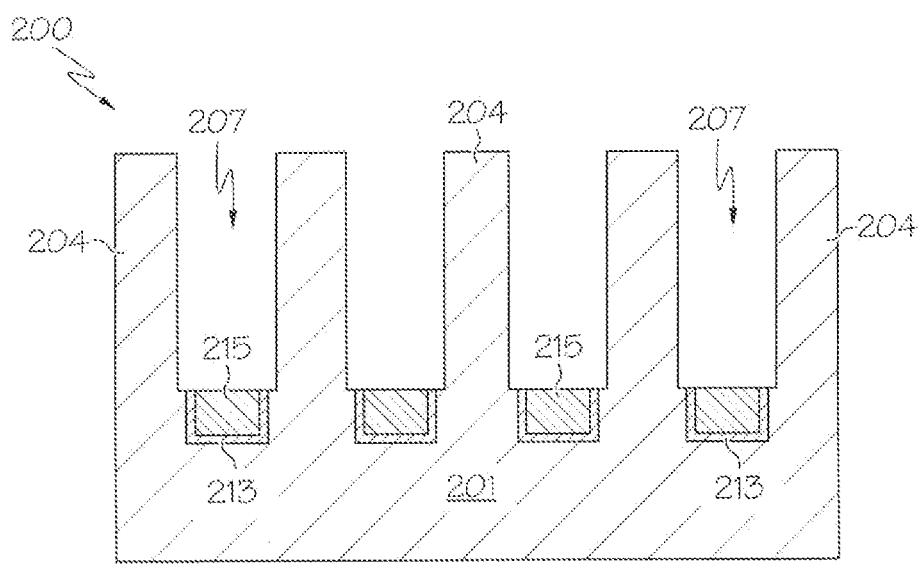
Figure 7:
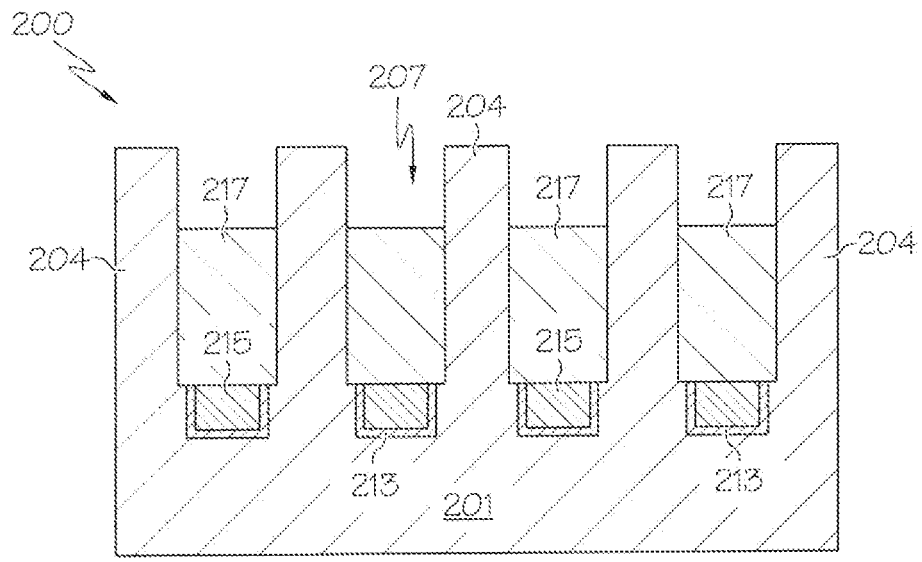

Referring to FIGS. 6 and 7, after formation of the bottom electrode is complete, the hard mask layer 205 and the side wall spacer layer 211 can be removed. Before or after removal of the hard mask layer 205 and the side wall spacer layer 211, an oxide layer 217, such as $SiO_x$, is deposited over the bottom electrode 215 to provide local oxide isolation between the fins. Furthermore, if desired, a nitride material, such as TiN, can be include in the oxide layer to provide tensile or compression strength, which as discussed above con improve the performance of the FinFET structure.

It is desirable to use an etchant for this process that will remove the mask layer 205 and the side wall spacer layer 211 without harming the fins 204 or the electrode 215. In one example, such selective removal may occur using a heated phosphoric acid/water ($H_3PO_4/H_2O$) solution. Where ($H_3PO_4/H_2O$) solution), it is desirable to deposit the oxide layer 217 prior to hard mask layer 205 and side wall spacer layer 211 removal, because the ($H_3PO_4/H_2O$) can potentially damage the electrode.

Figure 8:
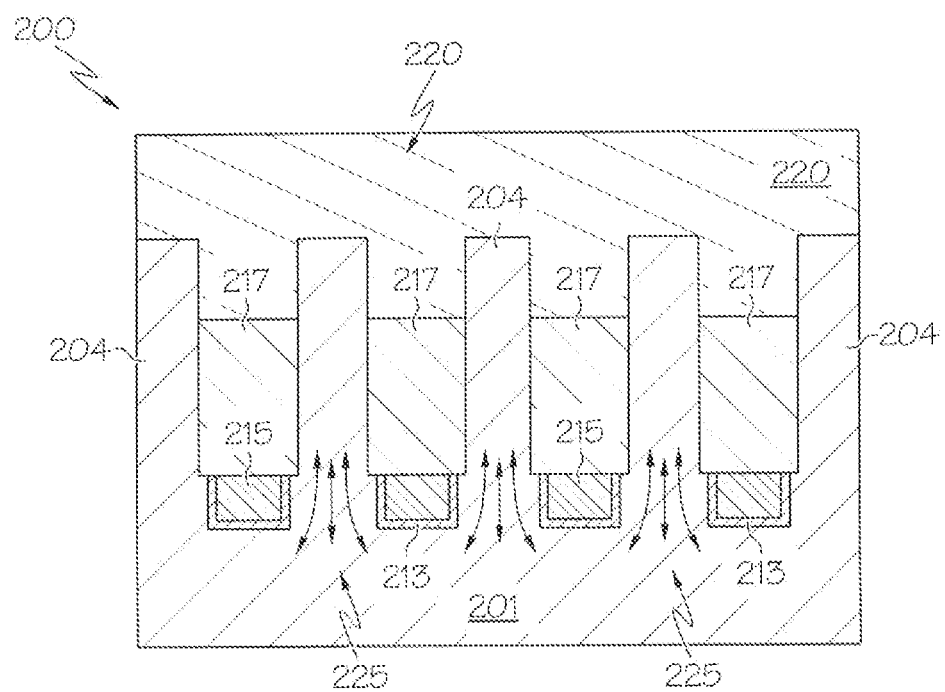

Referring to FIG. 8, the method is complete with the continued processing of the FinFET structure 200 to include, for example, the gate, contacts, and other modules known in the art (generally illustrated to as module 220 in FIG. 8), according to the design of the FinFET structure 200. These additional modules can be formed using techniques that are known in the art.

Figure 1:
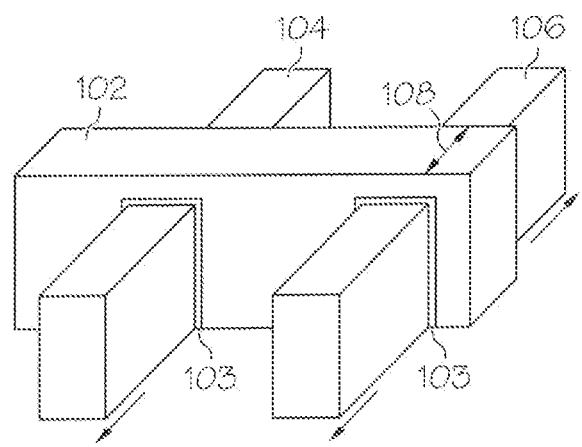
FIG. 1 is an isometric schematic view of a FinFET structure available in the prior art.

With reference now to the operation of the FinFET device 200, it is known from mathematical simulations of the electrical field in FinFET devices that, due to the gate electrode (gate 102, FIG. 1) wrapping around the fins, an electrical field is present along the length of the fins 204. Without being bound by theory, the introduction of the bottom electrode 215 at the bottom of the local oxide isolation 217 between the fins 204 causes an electrical field to be provided at the base of the fins 204, directing the electrical field into the fins in the manner shown in FIG. 8 (electrical field indicated by arrows 225). The voltage supplied to the bottom electrode 215 can therefore be used to change the $V_{th}$ of the FinFET device. Greater or lesser amounts of voltage can be supplied to the bottom electrode 215 to exert greater control over the $V_{th}$ than is currently available using methods known in the art. Furthermore, the distance from the fin channel to the bottom electrode and the aforementioned overlap/underlap can also impact $V_{th}$. In this manner, the bottom electrode 215 is acting as a back gate electrode, such as are commonly found in planar devices. The improved control over $V_{th}$ in turn will improve the operation and the design flexibility of the FinFET device.

In another embodiment, further control over $V_{th}$ can be achieved by varying the depth of the spaces 207 during the etching process described with regard to FIG. 2. For example, if the depth of the space 207 is relatively greater, a relatively taller fin 204 will be formed, thereby lessening the influence of the electrical field created by the bottom electrode 215 at the base of the fin 204. Conversely, if the depth of the space 207 is relatively smaller, a relatively shorter fin 204 will be formed, thereby increasing the influence of the bottom electrical field created by the bottom electrode 215 at the base of the fin 204.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:
1. A method for fabricating a FinFET structure, the method comprising the steps of:
fabricating a plurality of parallel fins overlying a semiconductor substrate, each of the plurality of parallel fins having sidewalls; and forming a bottom or substrate electrode over the semiconductor substrate and located at a bottom area and between the parallel fins, and isolated with the FinFET structure,
wherein the bottom or substrate electrode is configured to direct an electrical field into the fins, thereby affecting the threshold voltage of the FinFET structure.

2. The method of claim 1, further comprising forming sidewall spacers about the sidewalls of the plurality of parallel fins prior to forming the bottom or substrate electrode over the semiconductor substrate.

3. The method of claim 2, wherein forming sidewall spacers about the sidewalls of the plurality of parallel fins comprises forming silicon nitride or silicon oxide sidewall spacers.

4. The method of claim 2, further comprising etching the semiconductor substrate between the plurality of parallel fins after forming the sidewall spacers about the sidewalls of the plurality of parallel fins.

5. The method of claim 4, further comprising forming a thermal oxide layer on the semiconductor substrate after etching the semiconductor substrate.

6. The method of claim 5, wherein forming the bottom or substrate electrode over the semiconductor substrate comprises forming the bottom or substrate electrode over the thermal oxide layer.

7. The method of claim 1, wherein forming the bottom or substrate electrode over the semiconductor substrate comprises depositing a material comprising TiN.

8. The method of claim 1, wherein forming the bottom or substrate electrode over the semiconductor substrate comprises depositing a material comprising polysilicon.

9. The method of claim 8, further comprising silicidating the material comprising polysilicon after depositing the material comprising polysilicon.

10. A method for fabricating an semiconductor device, the method comprising the steps of:
providing a semiconductor substrate;
fabricating a plurality of parallel fins overlying the semiconductor substrate, each of the plurality of parallel fins having sidewalls; and
forming a bottom or substrate electrode over the semiconductor substrate and located at a bottom area and between the parallel fins, and isolated with the FinFET structure,
wherein the electrode is configured to direct an electrical field into the fins, thereby affecting the threshold voltage of the FinFET structure.

11. The method of claim 10, further comprising forming a local oxide isolation layer over the electrode.

12. The method of claim 11, further comprising forming one or more gates or contacts over the local oxide isolation layer.

13. The method of claim 10, further comprising forming sidewall spacers about the sidewalls of the plurality of parallel fins prior to forming the bottom or substrate electrode over the semiconductor substrate.

14. The method of claim 13, further comprising removing the sidewall spacers after forming the bottom or substrate electrode.

15. The method of claim 13, further comprising etching the semiconductor substrate between the plurality of parallel fins after forming the sidewall spacers about the sidewalls of the plurality of parallel fins.

16. The method of claim 15, further comprising forming a thermal oxide layer on the semiconductor substrate after etching the semiconductor substrate.

17. The method of claim 16, wherein forming the bottom or substrate electrode over the semiconductor substrate comprises forming the electrode over the thermal oxide layer.

18. The method of claim 10, wherein forming the bottom or substrate electrode over the semiconductor substrate comprises depositing a material comprising TiN.

19. The method of claim 10, wherein forming the bottom or substrate electrode over the semiconductor substrate comprises depositing a material comprising polysilicon.

20. A FinFET structure on a semiconductor device comprising:
a plurality of parallel fins overlying a semiconductor substrate, each of the plurality of parallel fins having sidewalls; and
an electrode formed over the semiconductor substrate and located at a bottom area and between the parallel fins, and isolated with the FinFET structure,
wherein the electrode is configured to direct an electrical field into the fins, thereby affecting the threshold voltage of the FinFET structure.

* * * * *